(12) United States Patent
Inukai et al.

(10) Patent No.: US 7,172,965 B2
(45) Date of Patent: Feb. 6, 2007

(54) METHOD FOR MANUFACTURING SEMICONDUCTOR DEVICE

(75) Inventors: Kazuaki Inukai, Ibaragi (JP); Atsushi Matsushita, Nagasaki (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/849,221

(22) Filed: May 20, 2004

(65) Prior Publication Data

US 2004/0235293 A1    Nov. 25, 2004

(30) Foreign Application Priority Data

May 21, 2003    (JP) ............................... 2003-143302

(51) Int. Cl.
*H01L 21/4763*    (2006.01)

(52) U.S. Cl. ............... 438/637; 438/725; 257/E21.024; 257/E21.033

(58) Field of Classification Search ................ 438/694, 438/725, 953, 948, 637; 257/E21.024, E21.02, 257/E21.033
See application file for complete search history.

(56) References Cited

U.S. PATENT DOCUMENTS

| | | | | |
|---|---|---|---|---|
| 4,201,579 A * | 5/1980 | Robinson et al. | ............ | 430/323 |
| 4,529,860 A * | 7/1985 | Robb | ............ | 219/121.41 |
| 5,691,117 A * | 11/1997 | Lutsic et al. | ............ | 430/329 |
| 6,103,616 A | 8/2000 | Yu et al. | | |
| 6,124,201 A * | 9/2000 | Wang et al. | ............ | 438/634 |
| 6,281,135 B1 | 8/2001 | Han et al. | | |
| 6,319,850 B1 * | 11/2001 | Chang et al. | ............ | 438/763 |
| 6,372,636 B1 * | 4/2002 | Chooi et al. | ............ | 438/639 |
| 6,426,304 B1 * | 7/2002 | Chien et al. | ............ | 438/727 |
| 6,465,352 B1 | 10/2002 | Aoki | | |
| 6,509,279 B2 | 1/2003 | Fujii et al. | | |
| 6,536,449 B1 * | 3/2003 | Ranft et al. | ............ | 134/1.1 |
| 6,607,986 B2 | 8/2003 | Seta et al. | | |
| 6,805,139 B1 * | 10/2004 | Savas et al. | ............ | 134/1.3 |
| 6,815,331 B2 * | 11/2004 | Lee et al. | ............ | 438/622 |
| 2002/0058397 A1 | 5/2002 | Smith et al. | | |
| 2002/0090833 A1 | 7/2002 | Matsuura | | |
| 2002/0119677 A1 | 8/2002 | Soda et al. | | |

(Continued)

FOREIGN PATENT DOCUMENTS

EP    1 308 994 A2    5/2003

(Continued)

OTHER PUBLICATIONS

IBM Tech. Discl. Bull. vol. 9, No. 9 (Feb. 1967) p. 1228.*

*Primary Examiner*—Caridad Everhart
(74) *Attorney, Agent, or Firm*—Leydig, Voit & Mayer, Ltd.

(57) ABSTRACT

After forming a stopper film on a semiconductor substrate having a copper wiring layer therein, an interlayer insulating film made of a low dielectric constant material is formed on the stopper film. Then, after forming a capping film on the interlayer insulating film, a resist film having a predetermined pattern is formed on the capping film. The capping film and the interlayer insulating film are etched using the resist film as a mask to form an opening reaching the stopper film. After that, the stopper film exposed by the opening is etched, with the resist film left in place, to form a via hole. Then, the resist film is removed by ashing.

19 Claims, 9 Drawing Sheets

U.S. PATENT DOCUMENTS

2002/0164877 A1   11/2002   Catabay et al.

FOREIGN PATENT DOCUMENTS

| JP | 04-261025 | 9/1992 |
| --- | --- | --- |
| JP | 06-232098 | 8/1994 |
| JP | 10-209118 | 8/1998 |
| JP | 2000-299318 | 10/2000 |
| JP | 2000-352827 | 12/2000 |
| JP | 2001-110775 | 4/2001 |
| JP | 2001-189302 | 7/2001 |
| JP | 2001-257262 | 9/2001 |
| JP | 2002-043422 | 2/2002 |
| JP | 2002-203852 | 7/2002 |
| JP | 2002-261092 | 9/2002 |
| JP | 2002-373937 | 12/2002 |

* cited by examiner

*Fig.6C*  *Prior Art*
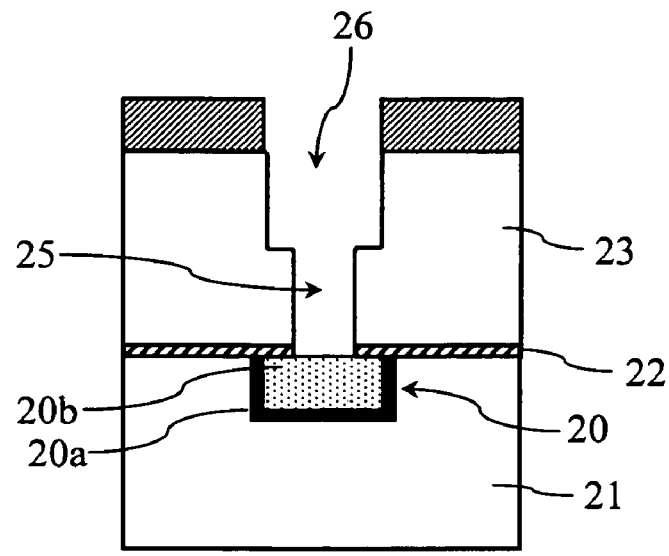
*Fig.6D*  *Prior Art*
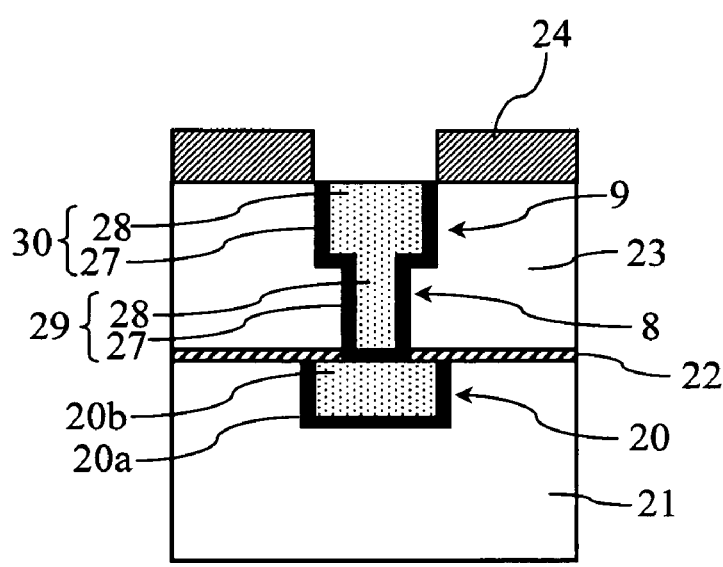

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device through a damascene technique using a low dielectric constant insulating film.

2. Background Art

In recent years, the speed of semiconductor devices has increased considerably, which has raised the problem of occurrence of a transmission delay due to a reduction in the signal propagation speed attributed to the wiring resistance and the parasitic capacitances between the wires and between the wiring layers in multilayered wiring portions. This problem has tended to worsen since the wiring resistance and the parasitic capacitance increase as the wiring width and the wiring pitch decrease with increasing integration density of the devices.

In order to prevent occurrence of a signal delay due to such increases in the wiring resistance and the parasitic capacitance, attempts have been made to employ copper wiring instead of aluminum wiring, as well as using a low dielectric constant insulating film (herein referred to as a Low-k film) as an interlayer insulating film.

As is known, a damascene technique may be used to form copper wiring using a Low-k film. This technique forms copper wiring without etching it, since the etching rate of copper is more difficult to control than that of aluminum.

Description will be made of a conventional copper wiring forming process using a damascene technique with reference to FIGS. 6 and 7. It should be noted that in these figures, like numerals are used to denote like components.

First of all, a stopper film 22 is formed on a silicon substrate 21 having a copper wiring layer 20 formed therein, as shown in FIG. 6A. The copper wiring layer 20 includes a barrier metal layer 20a and a copper layer 20b. Then, after forming a Low-k film 23 on the stopper film 22, a capping film 24 is formed on the Low-k film 23, producing the structure shown in FIG. 6B. Then, the capping film 24, the Low-k film 23, and the stopper film 22 are etched, forming a via hole 25 and a wiring groove 26, as shown in FIG. 6C. After that, a barrier metal 27 is formed on the inner surfaces of the via hole 25 and the wiring groove 26, and a copper layer 28 is buried in the via hole 25 and the wiring groove 26, forming a via plug 29 and a copper wiring layer 30. Thus, the above process can form copper wiring in which the copper wiring layer 20 formed in the silicon substrate 21 is electrically connected through the via plug 29 to the copper wiring layer 30 formed above the silicon substrate 21, as shown in FIG. 6D.

Specifically in the above process, the via hole 25 is formed as follows. First of all, a resist film 31 having a predetermined pattern is formed on the capping film 24, as shown in FIG. 7A. Then, the capping film 24 and the Low-k film 23 are etched by a photolithographic technique, forming an opening 32 reaching the stopper film 22, as shown in FIG. 7B. After that, the resist film 31, which is no longer necessary, is removed through ashing, and a stopper film 22a exposed at the opening 32 is etched to form a via hole 33, as shown in FIG. 7C.

In the conventional process of etching the stopper film 22a, however, etching of the stopper film 22a inevitably leads to etching of the capping film 24. Furthermore, the Low-k film 23 is exposed at the portion of the capping film 24 which has been removed due to the etching process and therefore the portion of the Low-k film 23 under the removed capping film portion is also etched. As a result, a cross-sectional shape of the via hole 33 is partially tapered as shown in FIG. 7C. If the Low-k film 23 has a tapered cross section as shown in FIG. 7C, it is not possible to form a copper wiring structure having an opening of desired dimensions, resulting in degraded electrical characteristics of the semiconductor device.

Further, the ashing of the resist film 31 is carried out through oxygen plasma treatment, causing the problem of the Low-k film 23 being plasma-damaged and thereby changed in quality. Such damage is significant if a porous Low-k film having a dielectric constant of less than 2.5 is used.

SUMMARY OF THE INVENTION

The present invention has been devised in view of the above problems. It is, therefore, an object of the present invention to provide a method for manufacturing a semiconductor device, capable of forming copper wiring having a desirable pattern shape.

Another object of the present invention is to provide a method for manufacturing a semiconductor device, capable of ashing the resist film without damaging the Low-k film.

According to one aspect of the present invention, in a method for manufacturing a semiconductor device, a stopper film is formed on a semiconductor substrate having a conductive layer formed therein. An interlayer insulating film is formed on the stopper film, the interlayer insulating film being made of a low dielectric constant material. A capping film is formed on the interlayer insulating film. A resist film is formed on the capping film, the resist film having a predetermined pattern. The capping film and the interlayer insulating film are etched using the resist film as a mask to form an opening reaching the stopper. The portion of the stopper film exposed at the opening is etched with the resist film left in place to form a via hole. After the step of forming the via hole, the resist film is removed through ashing.

Other and further objects, features and advantages of the invention will appear more fully from the following description.

BRIEF DESCRIPTION OF THE DRAWINGS

FIGS. 6A~6D are cross-sectional views illustrating the conventional method for manufacturing a semiconductor device.

DETAILED DESCRIPTION OF THE PREFERRED EMBODIMENTS

A preferred embodiment of the present invention will be described below in detail with reference to the accompanying drawings.

Figure 1A:
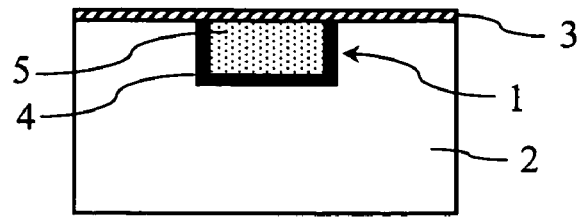
FIGS. 1A~1F are cross-sectional views illustrating a method for manufacturing a semiconductor device according to the present invention.

FIGS. 1A to 1F are cross-sectional views illustrating a method for manufacturing a semiconductor device according to an embodiment of the present invention. As shown in FIG. 1A, a stopper film 3 is formed on a semiconductor substrate 2 having a copper wiring layer 1 (a conductive layer) formed therein. The copper wiring layer 1 includes a barrier metal layer 4 and a copper layer 5. It should be noted that according to the present embodiment, another type of conductive layer may be formed instead of the copper wiring layer. For example, a wiring layer of a metal other than copper or an impurity doped region may be formed in the semiconductor substrate.

Examples of the semiconductor substrate 2 include, for example, a silicon substrate., The stopper layer 3 is preferably made of a material having a high etching selectivity ratio against the interlayer insulating film formed thereon. Specifically, for example, an SiC film, $Si_xN_y$ (e.g., $Si_3N_4$, $Si_2N_3$, SiN, etc.) film, SiCN film, or SiOC film may be used, though suitable materials vary depending on the type of interlayer insulating film. These films can be formed by a CVD (Chemical Vapor Deposition) technique, a sputtering technique, etc.

Figure 1B:
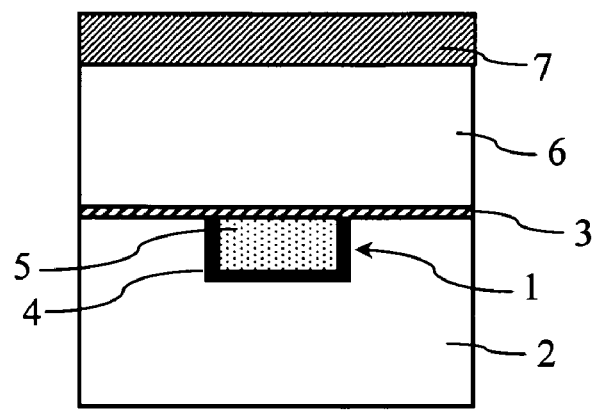

Then, as shown in FIG. 1B, an interlayer insulating film 6 is formed on the stopper film 3, and a capping film 7 is formed on the interlayer insulating film 6.

The interlayer insulating film 6 is preferably an insulating film of a low dielectric constant material (a Low-k film). For example, the interlayer insulating film 6 may be a porous $SiO_2$ film, SiOC film, or SOG (Spin on Glass) film. Examples of suitable material for the SOG film include hydrogen silsesquioxane (HSQ) and methyl silsesquioxane (MSQ). These films can be formed by a CVD technique, an SOD (Spin on Dielectric Coating) technique, etc.

The capping film 7 prevents the interlayer insulating film 6 from being etched when a resist film, described later, is formed. The capping film 7 also functions to protect the interlayer insulating film 6 in a polishing process performed when a copper wiring layer is formed. For example, the capping film 7 may be an $SiO_2$ film or $Si_xN_y$ (e.g., $Si_3N_4$, $Si_2N_3$, SiN, etc.) film formed by a CVD technique, a sputtering technique, etc.

Figure 1C:
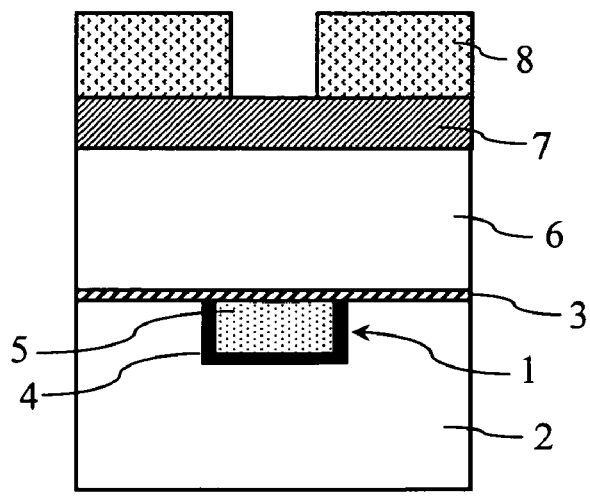

After forming the capping film 7, a resist film 8 having a predetermined pattern is formed on it, producing the structure shown in FIG. 1C. Specifically, a photoresist is coated on the capping film 7 and then exposed and developed to form the resist film 8.

Figure 1D:
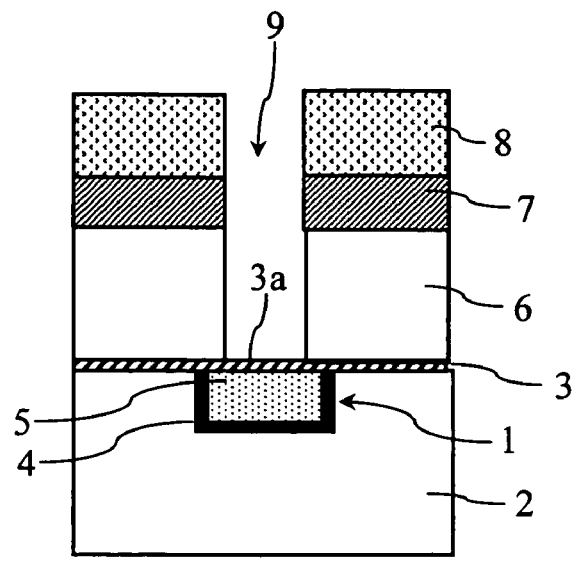

Then, the capping film 7 and the interlayer insulating film 6 are anisotropically etched, forming an opening 9. This etching automatically stops when the stopper film 3 has been reached. As a result, a portion 3a of the stopper film 3 is exposed at the opening 9, as shown in FIG. 1D.

An example of the etching equipment is a 2-frequency excitation parallel plate reactive ion etcher in which high frequency waves can be applied to the upper and lower electrodes at 60 MHz and 2 MHz. Specifically, a mixed gas consisting of octafluorobutene ($C_4F_8$), nitrogen ($N_2$), and argon (Ar) is introduced into the equipment, and the pressure within the equipment is maintained at 75 mT. In this state, powers of 2,400 W and 3,300 W are applied to the upper and lower electrodes, respectively, to generate plasma. At that time, the flow rate ratio of the components of the etching gas may be set such that the flow rate of octafluorobutene is 15 sccm, that of nitrogen is 225 sccm, and that of argon is 1,400 sccm. Further, the surface temperature of the stage on which the semiconductor substrate is placed may be maintained at 40° C.

The capping film 7 and the interlayer insulating film 6 may be etched by use of a gas other than the above mixed gas. For example, it is possible to use a mixed gas consisting of tetrafluoromethane ($CF_4$), difluoromethane ($CH_2F_2$), neon (Ne), and argon (Ar).

After etching the capping film 7 and the interlayer insulating film 6, the stopper film 3a exposed at the opening 9 is etched to form a via hole. The present embodiment is characterized in that the stopper film 3a is etched with the resist film 8 left in place.

The stopper film 3a is preferably etched immediately after the capping film 7 and the interlayer insulating film 6 are etched. Specifically, these steps are preferably sequentially performed using the same etching equipment. This arrangement can enhance the throughput of the semiconductor device manufacturing process, as well as preventing adhesion of foreign material, resulting in increased yield.

For example, a mixed gas consisting of tetrafluoromethane ($CF_4$) and nitrogen ($N_2$) is introduced into the above 2-frequency excitation parallel plate reactive ion etcher, and the pressure within the etcher is maintained at 150 mT. In this state, powers of 1,000 W and 200 W are applied to the upper and lower electrodes, respectively, to generate plasma. At that time, the flow rate ratio of the components of the etching gas may be set such that the flow rate of tetrafluoromethane is 50 sccm and that of nitrogen is 300 sccm. Further, the surface temperature of the stage on which the semiconductor substrate is placed may be maintained at 40° C.

Thus, the present embodiment etches the stopper film 3a with the resist film 8 left on the capping film 7, preventing the capping film 7 from being etched. This can also prevent the interlayer insulating film 6 formed under the capping film 7 from being etched. Therefore, this arrangement can prevent the capping film 7 and the interlayer insulating film 6 from having a tapered cross section, forming a via hole having good pattern characteristics.

Figure 1E:
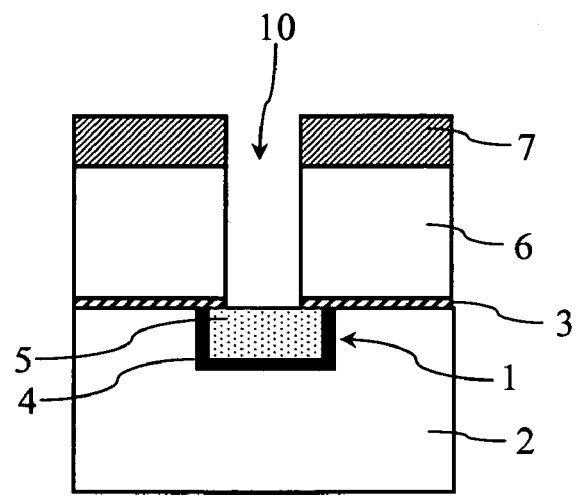

After etching the stopper film 3a, the resist film 8, which is no longer necessary, is removed through ashing, forming a via hole 10 shown in FIG. 1E. It should be noted that the copper wiring layer 1 (the under layer) is exposed at the bottom surface of the via hole 10.

Incidentally, in the conventional method in which the resist film is ashed before the stopper film is etched, the ashing is carried out under a pressure of 0.1 Torr or less at a temperature equal to or lower than ambient temperature using oxygen ($O_2$) gas, ammonia ($NH_3$) gas, or a mixed gas consisting of nitrogen ($N_2$) and hydrogen ($H_2$), for example. However, since the density of an interlayer insulating film decreases with decreasing dielectric constant, the above interlayer insulating film (6) having a low dielectric constant is likely to be damaged by ashing and may suffer a crack, etc. The interlayer insulating film will suffer considerable damage under the above conventional conditions. The damage is quite significant especially when the interlayer insulating film is a porous film having a dielectric constant of less than 2.5.

After intensive study of this problem, the inventor has found that the resist film may be ashed at a temperature higher than ambient temperature using a mixed gas consisting of hydrogen and an inert gas to prevent damage to the interlayer insulating film. Examples of inert gases include gases unreactive with hydrogen, such as helium (He) and argon (Ar). It should be noted that nitrogen ($N_2$) gas is not suitable for this purpose since it inflicts more damage to the interlayer insulating film than such inert gases.

Figure 2A:
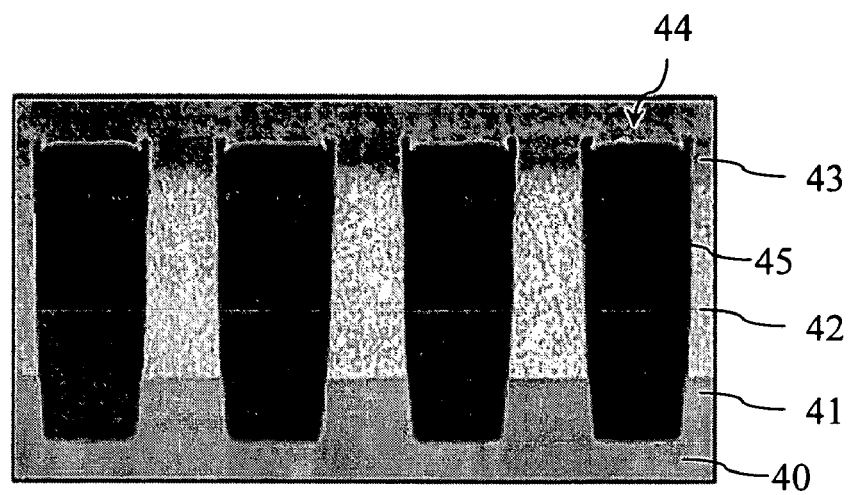
FIGS. 2A and 2B are cross-sectional TEM photographs according to the present invention.

FIG. 2A shows a cross-sectional TEM (Transmission Electron Microscopy) photograph of a sample taken after the resist film has been ashed by use of a mixed gas consisting of hydrogen and helium. It should be noted that for comparison, FIG. 2B shows a cross-sectional TEM photograph of another sample taken after the resist film has been ashed by use of ammonia gas.

Figure 2B:
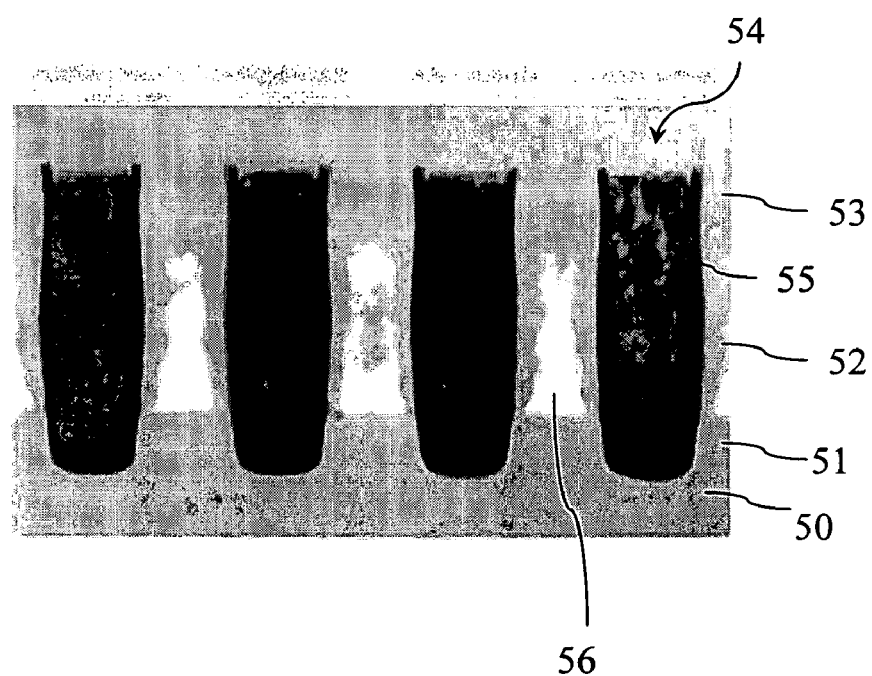

The sample shown in FIG. 2B is configured such that a stopper film 51, a Low-k film 52, and a capping film 53 are laminated onto one another over a silicon substrate 50, and a copper wiring layer 55 is buried in a via hole 54. The photograph of FIG. 2B shows that the ashing process has damaged the Low-k film 52; the Low-k film 52 has a void 56 and the sidewalls of the via hole 54 have a bowing shape.

The configuration of the sample shown in FIG. 2A is similar to that of the sample shown in FIG. 2B. That is, the sample shown in FIG. 2A is configured such that a stopper film 41, a Low-k film 42, and a capping film 43 are laminated onto one another over a silicon substrate 40, and a copper wiring layer 45 is buried in a via hole 44. However, the photograph of FIG. 2A shows that the ashing process has not damaged the Low-k film 42; the Low-k film 42 has no voids and the via hole 44 has a desirable cross-sectional shape.

The ashing process preferably uses a mixed gas consisting of an inert gas and 1 to 40 volume percent hydrogen with respect to the inert gas. Mixing less than 1 volume percent of hydrogen reduces the ashing rate, which is not desirable in terms of throughput. Mixing more than 40 volume percent of hydrogen is not desirable in terms of safety.

Figure 3:
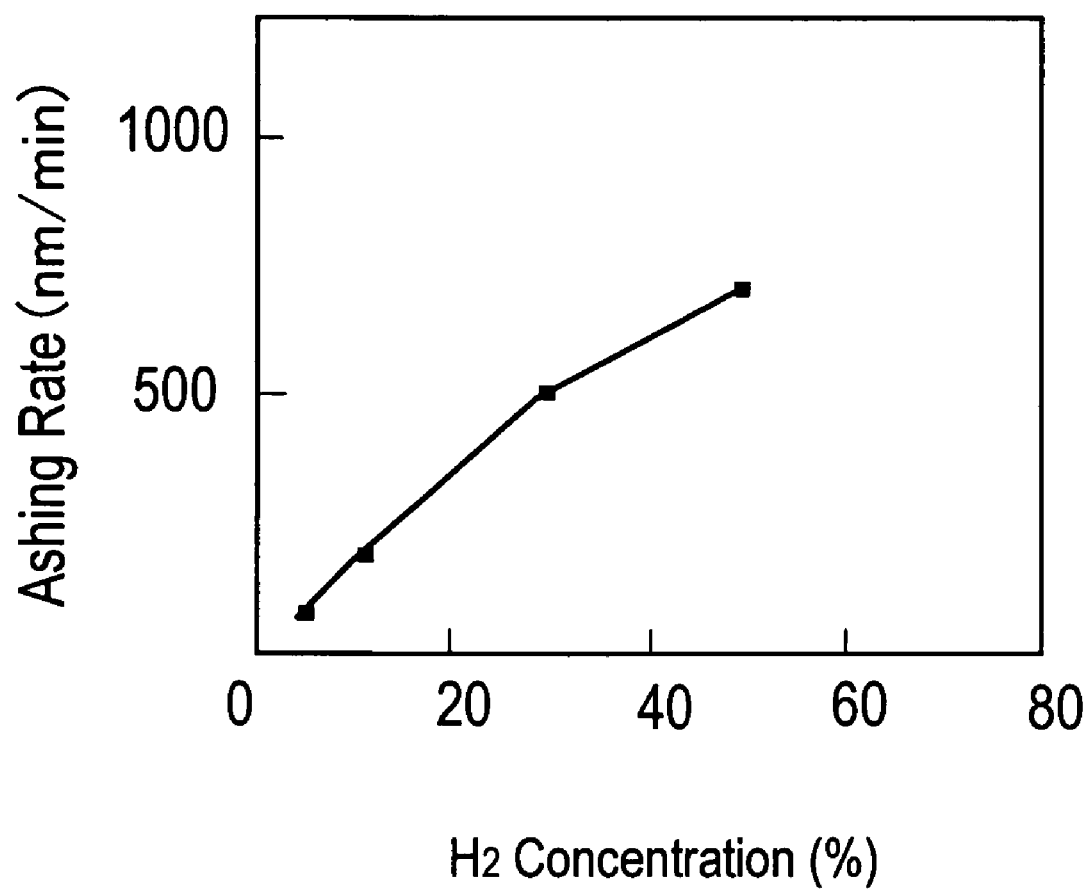
FIGS. 3 and 4 show how the ashing rate changes with changing hydrogen concentration according to the present invention.

FIG. 3 shows how the ashing rate changes with changing hydrogen concentration of a mixed gas consisting of hydrogen and argon. As can be seen from the figure, the higher the hydrogen concentration, the higher the ashing rate. The volume percent of the hydrogen with respect to the argon is preferably set between 10% and 40% to ensure sufficient throughput and safety.

Figure 4:
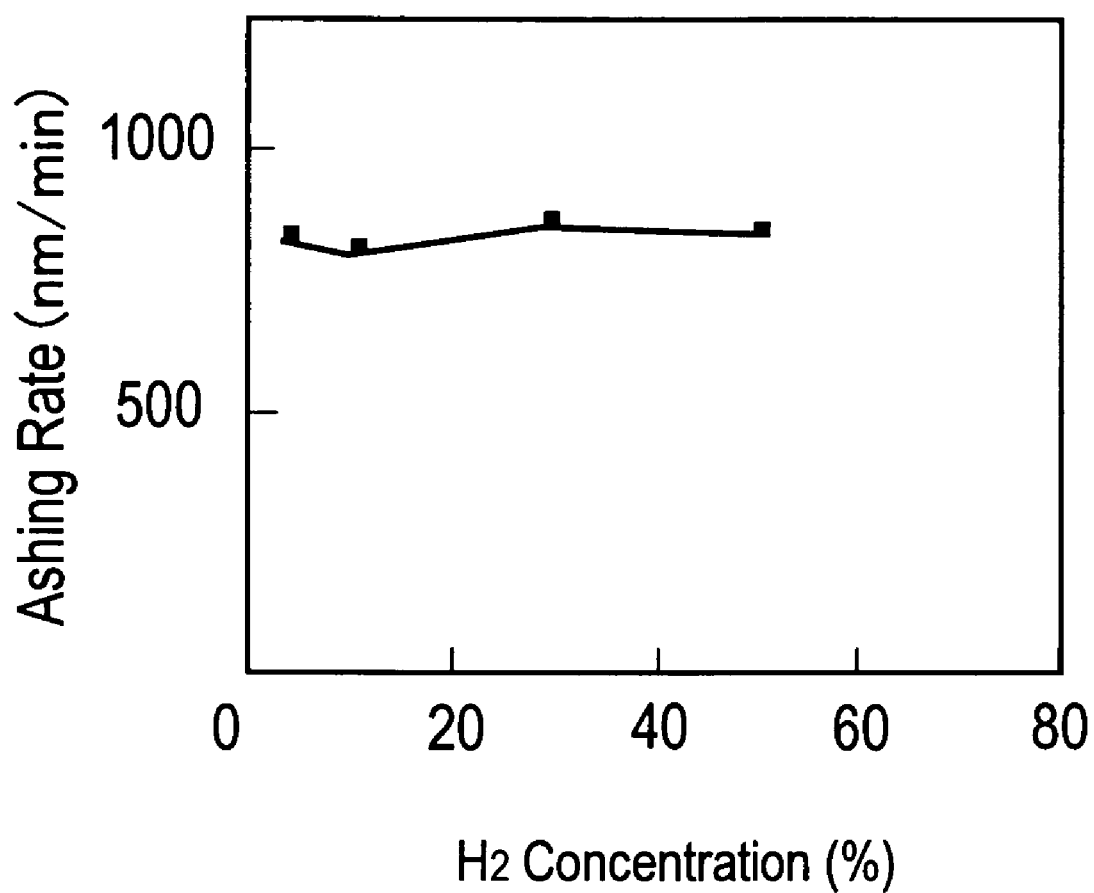

FIG. 4 shows how the ashing rate changes with changing hydrogen concentration of a mixed gas consisting of hydrogen and helium. As can be seen from the figure, a desirable ashing rate can be obtained regardless of the hydrogen concentration when helium is used. Therefore, the amount of hydrogen mixed with the helium can be freely changed over the range between 1 volume percent and 40 volume percent. However, the volume percent of the hydrogen is preferably set between 1% and 30% when safety is emphasized.

The ashing is preferably carried out at a temperature higher than ambient temperature (as described above). Particularly, the temperature is preferably set between 200° C. and 400° C. Temperatures lower than 200° C. lead to a decrease in the ashing speed, resulting in reduced throughput. Temperatures higher than 400° C., on the other hand, lead to increased oxidation and diffusion of copper. It should be noted that the pressure at which the ashing is carried out is preferably set to an appropriate value according to the temperature. For example, if the temperature is set within the above temperature range, pressures between 0.1 Torr and 10 Torr are preferable in terms of throughput.

Figure 5:
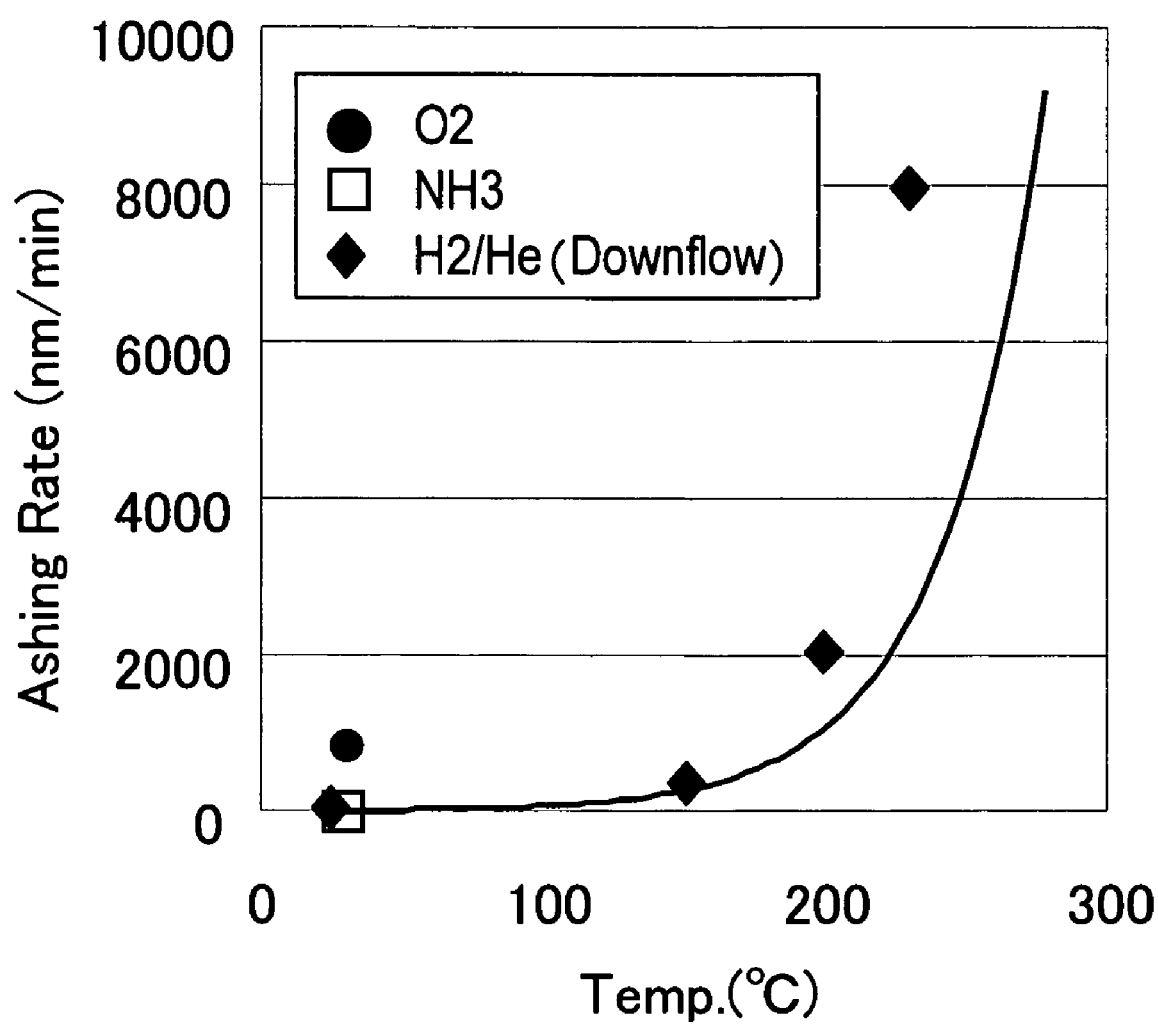
FIG. 5 is a diagram showing how the ashing rate changes with temperature according to the present invention.
Figure 6A:
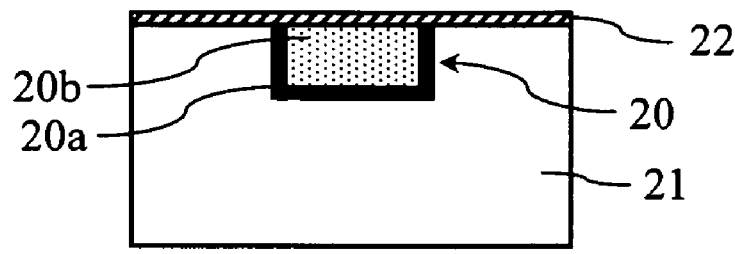
Figure 6B:
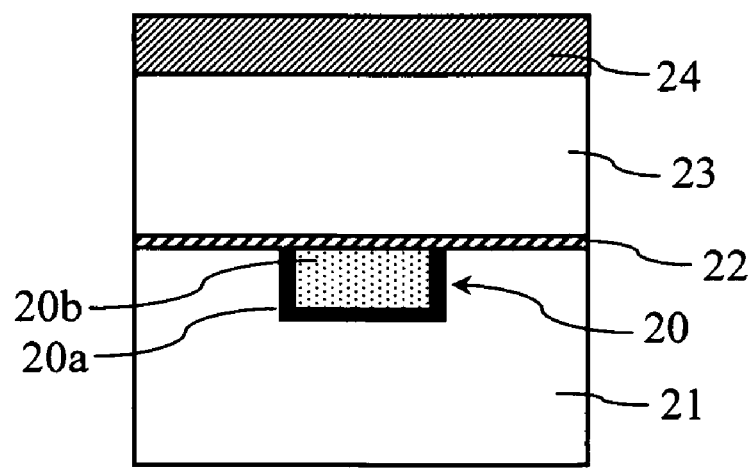
Figure 7A:
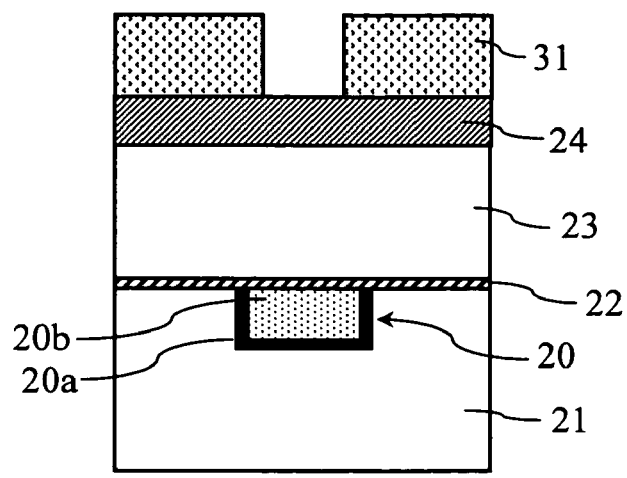
FIGS. 7A–7C are cross-sectional views illustrating the conventional method for manufacturing a semiconductor device.
Figure 7B:
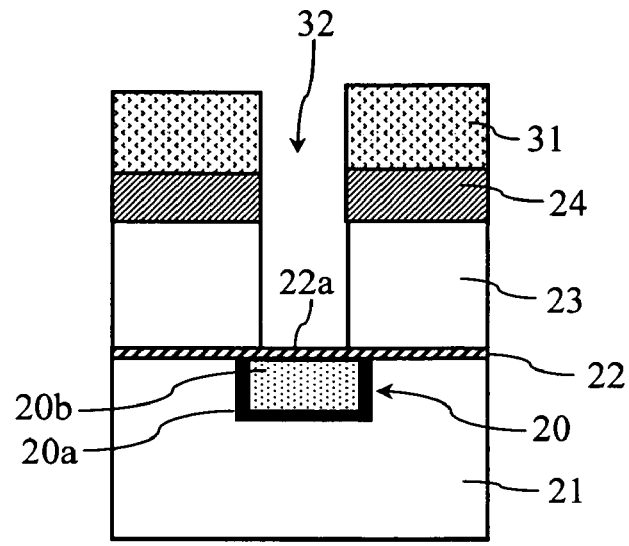
Figure 7C:
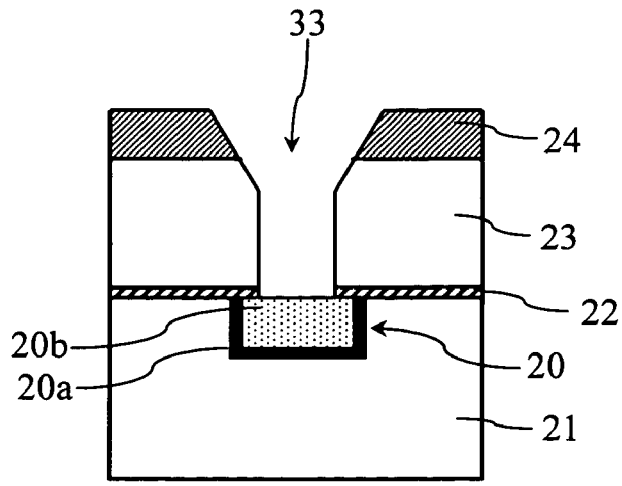

FIG. 5 is a diagram showing how the ashing rate changes with temperature when a mixed gas consisting of hydrogen and helium is used. It should be noted that FIG. 5 also shows how the ashing rate changes with temperature when oxygen gas or ammonia gas is used, for comparison. The ashing was carried out under a pressure of 133 Pa with a plasma power of 2,000 W using a remote plasma apparatus. The volume percent of the hydrogen with respect to the helium gas was set to 5%. As shown in FIG. 5, the ashing rate exponentially increases with increasing temperature.

Figure 1F:
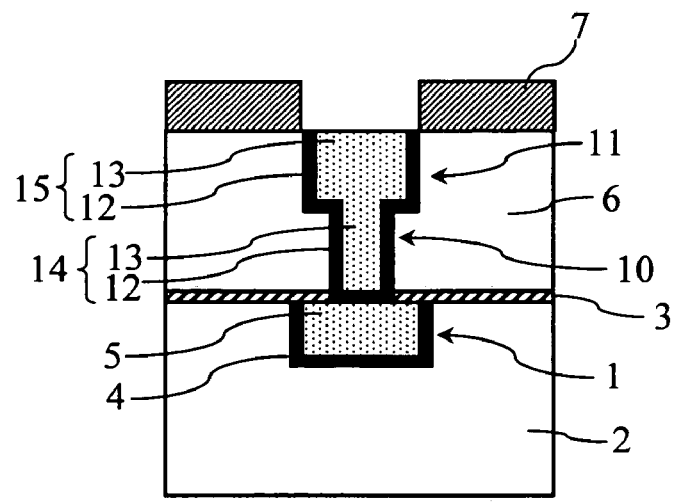

After forming the via hole 10 in the interlayer insulating film 6 in the above process, a wiring groove 11 is formed over the via hole 10 by a photolithographic technique. Subsequently, a barrier metal film 12 is formed on the inner surfaces of the via hole 10 and the wiring groove 11, and then a copper layer 13 is formed on the barrier metal film 12 such that the copper layer 13 fills the vial hole 10 and the wiring groove 11, forming a via plug 14 and a copper wiring layer 15, as shown in FIG. 1F. Specifically, this step is performed as follows.

First of all, after forming a barrier metal film such as a titanium nitride film or a tantalum nitride film, a copper layer is formed on it. Then, the copper layer and the barrier metal film are polished by a chemical metal polishing (CMP) technique such that the copper layer and the barrier metal film are left only within the via hole and the wiring groove.

It should be noted that other methods may be used to form the barrier metal film and bury the copper layer in the via hole and in the wiring groove. For example, after forming a barrier metal on the inner surface of the wiring groove by a CVD or CMP technique, copper may be buried within the wiring groove by a plating technique using an electrolyte predominantly composed of copper sulfate ($CuSO_4$).

The above steps form the via plug 14 and the copper wiring layer 15 on the semiconductor substrate 2 having the copper wiring layer 1 formed therein, as shown in FIG. 1F. It should be noted that the copper wiring layer 15 is electrically connected with the copper wiring layer 1 through the via plug 14.

The features and advantages of the present invention may be summarized as follows.

According to the present invention, the stopper film is etched with the resist film left in place so as to prevent the capping film and the interlayer insulating film from being etched, making it possible to manufacture a semiconductor device having a desirable pattern shape.

Further according to the present invention, the resist film is removed through ashing at a temperature higher than ambient temperature using a mixed gas consisting of hydrogen and an inert gas so as to prevent damage to the interlayer insulating film, making it possible to manufacture a semiconductor device having good characteristics.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-143302, filed on Jun. 21, 2003 including specification, claims, drawings and summary, on which the Convention priority of the present application is based, are incorporated herein by reference in its entirety.

What is claimed is:

1. A method for manufacturing a semiconductor device, said method comprising:
    forming a stopper film on a semiconductor substrate having a conductive layer therein;
    forming an interlayer insulating film on said stopper film, said interlayer insulating film being a low dielectric constant material;
    forming a capping film on said interlayer insulating film;

forming a resist film on said capping film, said resist film having a predetermined pattern;

etching said capping film and said interlayer insulating film using said resist film as a mask to form an opening reaching said stopper film;

with said resist film left in place, etching the portion of said stopper film exposed by said opening to form a via hole; and after forming said via hole, removing said resist film by ashing in a mixture consisting of hydrogen and an inert gas that does not react with hydrogen.

2. The method as claimed in claim 1, further comprising:

forming a barrier metal film on an inner surface of said via hole; and forming a copper layer on said barrier metal film such that said copper layer fills said via hole.

3. The method as claimed in claim 1, including ashing at a temperature of 200° C. to 400° C., wherein the inert gas is selected from the group consisting of argon and helium.

4. The method as claimed in claim 3, wherein the volume percent of the hydrogen with respect to the inert gas is 1% to 40%.

5. The method as claimed in claim 4, wherein the inert gas is argon and the volume percent of the hydrogen with respect to the argon is 10% to 40%.

6. The method as claimed in claim 4, wherein the inert gas is helium and the volume percent of the hydrogen with respect to the helium is 1% to 30%.

7. The method as claimed in claim 1, wherein said conductive layer is a copper wiring layer.

8. The method as claimed in claim 1, wherein said interlayer insulating film is selected from the group consisting of a porous $SiO_2$ film, a porous SiOC film, and a porous spin on glass film.

9. The method as claimed in claim 1, wherein said stopper film is selected from the group consisting of an SiC film, an $Si_xN_y$ film, an SiCN film, and an SiOC film.

10. The method as claimed in claim 1, wherein said capping film is one of an $SiO_2$ film and an $Si_xN_y$ film.

11. The method as claimed in claim 2, including ashing at a temperature of 200° C. to 400° C., wherein the inert gas is selected from the group consisting of argon and helium.

12. The method as claimed in claim 11, wherein the volume percent of the hydrogen with respect to the inert gas is 1% to 40%.

13. The method as claimed in claim 12, wherein the inert gas is argon and the volume percent of the hydrogen with respect to the argon is 10% to 40%.

14. The method as claimed in claim 12, wherein the inert gas is helium and the volume percent of the hydrogen with respect to the helium is 1% to 30%.

15. The method as claimed in claim 2, wherein said conductive layer is a copper wiring layer.

16. The method as claimed in claim 3, wherein said conductive layer is a copper wiring layer.

17. The method as claimed in claim 2, wherein said interlayer insulating film is selected from the group consisting of a porous $SiO_2$ film, a porous SiOC film, and a porous spin on glass film.

18. The method as claimed in claim 2, wherein said stopper film is selected from the group consisting of an SiC film, an $Si_xN_y$ film, an SiCN film, and an SiOC film.

19. The method as claimed in claim 2, wherein said capping film is one of an $SiO_2$ film and an $Si_xN_y$ film.

* * * * *